(12) United States Patent
Liu et al.

(10) Patent No.: US 6,350,659 B1
(45) Date of Patent: Feb. 26, 2002

(54) PROCESS OF MAKING SEMICONDUCTOR DEVICE HAVING REGIONS OF INSULATING MATERIAL FORMED IN A SEMICONDUCTOR SUBSTRATE

(75) Inventors: Chun-Ting Liu, Berkeley Heights; Chien-Shing Pai, Bridgewater, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/388,297

(22) Filed: Sep. 1, 1999

(51) Int. Cl.$^7$ .................................................. H10L 21/76
(52) U.S. Cl. ........................ 438/424; 438/425; 257/510
(58) Field of Search ................................ 438/421–427, 438/429, 413, 442, 386; 257/500, 501, 510

(56) References Cited

U.S. PATENT DOCUMENTS

| | | | |
|---|---|---|---|
| 4,570,330 A | 2/1986 | Cogan | 29/576 |
| 5,460,981 A | 10/1995 | Terashima et al. | |
| 5,494,846 A | 2/1996 | Yamazaki | |
| 5,510,645 A | 4/1996 | Fitch et al. | 257/522 |
| 5,686,343 A | * 11/1997 | Lee | 438/413 |
| 5,783,476 A | 7/1998 | Arnold | 438/425 |
| 5,863,823 A | 1/1999 | Burgener | 438/295 |
| 5,869,386 A | 2/1999 | Hamajima et al. | 438/455 |
| 5,882,958 A | 3/1999 | Wanlass | 438/149 |
| 5,891,763 A | 4/1999 | Wanlass | 438/149 |
| 5,949,125 A | * 9/1999 | Meyer | 357/510 |

OTHER PUBLICATIONS

Kubota et al., *IEEE*, "A New Soft–Error Immune Dram Cell With a Transistor On A Lateral Epitaxial Silicon Layer", pp. 344–347, 1987.

Yoshimi et al., *IEEE*, "Technology Trends Of Silicon–On–Insulator–Its Advantages And Problems To Be Solved–", pp. 429–432, 1994.

* cited by examiner

Primary Examiner—David Nelms
Assistant Examiner—Dung A Le
(74) Attorney, Agent, or Firm—Richard J. Botos

(57) ABSTRACT

A process for fabricating a silicon-on-insulator integrated circuit in conjunction with a process for shallow trench isolation is disclosed. The shallow trench isolation is performed to define active regions in the silicon substrate. The active regions are electrically isolated from each other by regions of silicon dioxide formed in the substrate by the shallow trench isolation process. The height of the silicon dioxide regions above the substrate surface defines the combined thickness of the islands of silicon dioxide and the silicon formed over the islands of silicon dioxide.

A mask is then formed on the silicon substrate with the regions of silicon dioxide formed therein. The mask defines the regions on the silicon substrate surface on which the islands of silicon dioxide are to be formed. The silicon dioxide islands are formed with the mask in place, and the mask is subsequently removed. Single crystal silicon is formed epitaxially on the structure. This is followed by the deposition of amorphous silicon and recrystallization to form a structure that has islands of insulating silicon dioxide formed in the silicon substrate and below the substrate surface.

12 Claims, 1 Drawing Sheet

PROCESS OF MAKING SEMICONDUCTOR DEVICE HAVING REGIONS OF INSULATING MATERIAL FORMED IN A SEMICONDUCTOR SUBSTRATE

BACKGROUND OF THE INVENTION

1. Technical Field

The present invention is directed to a semiconductor device which has insulating regions formed in the semiconductor substrate on which the devices are formed. The present invention is also directed to a process for fabricating a semiconductor device in which the formation of these insulating regions is integrated with shallow trench isolation.

2. Art Background

Silicon-on-insulator (SOI) substrates have been offered as a solution to the problem of stray capacitance. The reduction in stray capacitance permits higher operating frequencies. SOI provides other advantages such as lower threshold voltage, minimum junction leakage, better packing density, borderless contacts, latch-up freedom and radiation hardness.

SOI circuits have been fabricated by forming a thin film of crystalline silicon on a layer of silicon dioxide that was formed on a semiconductor support wafer. Many methods have been proposed for forming such structures. Achieving a successful processing solution to forming an SOI substrate has been complicated because the thin silicon film is required to be crystalline silicon and must be less than about 200 nm thick in order to optimize the circuit performance. Another challenge has been making the thickness of this thin silicon film sufficiently uniform.

Another difficulty with current SOI is that the transistor body (i.e. substrate) connections are left to "float." That is, the electrical potential at the interface between the silicon film and the insulator is not set to any fixed value. Consequently, the threshold voltage and other device parameters fluctuate randomly.

One method for fabricating an SOI MOS transistor is described in U.S. Pat. No. 5,891,763 to Wanless (Wanless hereinafter). In the Wanless process, a layer of silicon dioxide is formed on a single crystal silicon substrate. A layer of silicon nitride is formed over the layer of silicon dioxide. Windows are formed in the two-layer structure that define the location of the transistors. Silicon dioxide is grown in these windows, and windows are formed in that oxide layer. These windows later align with transistor channel locations. Amorphous silicon is then deposited over the resulting structure. The structure is then chemically-mechanically polished to remove the amorphous silicon outside the device areas. The amorphous silicon deposited in the window remains. The structure is annealed to convert the amorphous silicon to single-crystalline silicon. The windows formed in the insulating layer permit the transistor regions to be formed directly on the silicon substrate. The insulating layer is interposed between the regions other than the transistor regions and the semiconductor substrate.

A similar type of device is described in Kubota, T., et al., "A New Soft-Error Immune DRAM Cell with a Transistor on a Lateral Epitaxial Silicon Layer," *IEDM* 87, Vol. 14.6, pp. 344–345 (1987). In this device, a transistor and a stacked capacitor are formed on a single substrate. Again, in this device, a layer of silicon dioxide is formed on a silicon substrate. A two-level cutout is formed in the layer of silicon dioxide. The upper level of the two-level cutout is wider than the lower level. The upper level defines the transistor area. A layer of silicon is then epitaxially formed on the structure, and the structure is then polished back so the only epitaxial silicon that remains is the silicon in the two-level cutout. The epitaxial silicon in the cutout is in contact with the silicon substrate on which the layer of silicon dioxide is formed. However, the insulator film is interposed between the stacked capacitor and the substrate.

The processes for making devices which have the advantages of the SOI substrate yet avoid the "floating body" effect by allowing contact between the device silicon and the silicon substrate are complex in that they require complex lithography and etching steps in order to define windows of the desired dimension into the silicon dioxide layer. Lithography is required because there is currently no self-aligned technique for forming the windows through the silicon dioxide layer in relation to the device structures formed above the silicon dioxide layer. Accordingly, alternative processes for forming SOI transistors are sought.

SUMMARY OF THE INVENTION

The present invention is a process for fabricating a silicon-on-insulator (SOI) MOS transistor that is integrated with a process for shallow trench isolation. In the process of the present invention, shallow trench isolation is first performed on a silicon substrate. The shallow trench isolation process is well known to one skilled in the art. In the shallow trench isolation process, a pad oxide layer is formed on the silicon substrate. Over that pad oxide layer is formed a layer of material that serves as an etch stop for a subsequent chemical mechanical polishing step (e.g. silicon nitride, amorphous silicon, polycrystalline silicon, doped silicon oxide). It is advantageous if the etch stop layer is silicon nitride, because expedients for the subsequent removal of silicon nitride are more compatible with current processing than the expedients that are required to remove amorphous or polycrystalline silicon or doped silicon dioxide. By way of example, and not by limitation, the CMP stop layer is referred to herein as a silicon nitride layer. The combined thickness of the pad oxide and silicon nitride layer defines the combined thickness of the insulating islands subsequently formed on the substrate and the thickness of the single crystalline silicon formed over the insulating islands.

Trenches are formed in the silicon substrate with the dual-layer, pad oxide/silicon-nitride formed thereon. The depth of the trench is selected to define the depth of an insulating region that electrically isolates active surface portions of the integrated circuit formed on the silicon substrate from one another. The one or more different components of the circuit, such as transistors, capacitors, resistors and/or diodes, are formed in the different discrete portions and then electrically connected together by conductors on said active surface.

After the trenches are formed in the substrate, a layer of silicon dioxide is deposited over the substrate to fill the trenches. Conventional techniques such as TEOS (tetraethyl orthosilicate) of HDP (high density plasma) are contemplated as suitable for silicon dioxide layer. The silicon dioxide deposited on the surface of the silicon nitride layer is removed, and the silicon dioxide deposited in the trenches remains. Chemical mechanical polishing is a suitable expedient for removing the silicon dioxide. The silicon nitride layer serves as a stop layer for the chemical mechanical polishing step. In a conventional shallow trench isolation process, the silicon nitride and silicon dioxide layers are then removed from the substrate surface. In the present process, the silicon nitride and silicon dioxide layers are used in further processing.

The silicon nitride/silicon dioxide layer is then patterned to define the regions in the substrate in which the islands of insulating material are to be formed. The silicon nitride layer is patterned using standard lithographic techniques. In standard lithography for device fabrication, a pattern is formed in an energy-sensitive resist material that is formed on the silicon nitride layer. That pattern is then transferred into the underlying silicon nitride layer using a conventional etch expedient. The patterned layer of energy-sensitive material is then removed, leaving the patterned layer of silicon nitride on the substrate. The pattern has open regions through which the surface of the underlying substrate is exposed. These open regions define the placement of the islands of insulating material in the substrate.

The substrate is then subjected to an elevated temperature in an oxygen-containing atmosphere in order to oxidize the regions of silicon substrate exposed through the silicon nitride mask. The thickness of the silicon dioxide regions so formed selected to eliminate the junction leakage current from the devices subsequently formed over the insulating islands. Consequently, the thickness of the silicon dioxide as at least about 15 nm. This as-formed thickness ensures that, after subsequent processing, a thickness of at least about 5 nm remains. It is advantageous if the insulating regions also reduce or eliminate the junction capacitance of the devices subsequently formed over the islands of insulating material. In this regard it is advantageous if the islands of insulating material have a thickness of about 50 nm to about 100 nm.

The mask of silicon nitride and underlying pad oxide is then removed. The silicon underlying the mask is thereby exposed. Silicon is then epitaxially grown on the exposed silicon surfaces. Single crystal silicon is formed on the exposed silicon surfaces and over a small portion of the silicon dioxide islands adjacent to the exposed silicon surfaces. Single crystal silicon is otherwise not formed on the silicon dioxide insulating regions.

In order to form single crystal silicon over the silicon dioxide islands, amorphous silicon is deposited over the structure. The structure is then heated at a temperature and for a duration sufficient to recrystallize the amorphous silicon. The structure is then further processed to remove the amorphous silicon deposited and recrystallized over the silicon insulating regions and to planarize the substrate surface. Chemical mechanical polishing is one example of a suitable expedient for accomplishing this objective. The resulting structure has silicon dioxide insulating regions that separate active regions in the substrate. At least one active region has silicon dioxide islands formed beneath the single crystalline surface.

One advantage of the process of the present invention is that the insulating regions as well as the active regions above the insulating regions are self-aligned with the trench isolation regions. Consequently, complex lithography is not required to align the insulating regions with the trench isolation regions. In addition to avoiding the more complex lithographic alternative, the precise alignment of the trench isolation regions and the insulating regions provides for more efficient use of the surface area of the substrate. Since the current trend is to increase the number of devices per unit of substrate surface area, processes that permit more efficient use of the substrate surface area are desired. Also, the thickness of the active silicon region is defined by the height of the shallow trench isolation. Consequently, the thickness of the active silicon region is controllable and uniform for all of the devices. This enables the fabrication of an integrated circuit in which the device parameters (e.g., threshold voltage, dopant profiles, etc.) are both precise and consistent.

DETAILED DESCRIPTION

Figure 1:
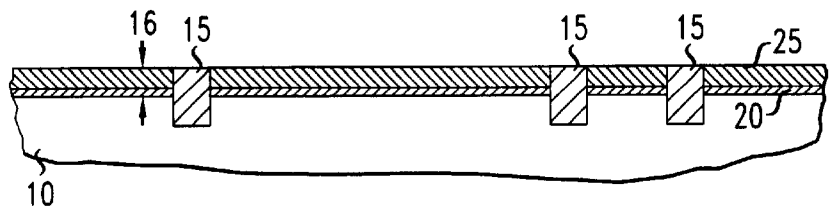
FIGS. 1–5 depict a cross-section of a silicon substrate during certain steps of one embodiment of the process of the present invention.

The present invention is described with reference to FIGS. 1–5. FIG. 1 is a cross-section of a silicon substrate 10 on which silicon dioxide layer 20 and a silicon nitride layer 25 are formed. Insulating regions 15 of silicon dioxide are formed in the substrate using a conventional shallow trench isolation technique. Shallow trench isolation processes are well known to one skilled in the art and are not discussed in detail herein. The height 16 of the insulating regions 15 of silicon dioxide above the surface of the silicon substrate 10 is selected to define the combined thickness of the subsequently formed islands of insulating material and the thickness of the single crystal silicon formed over the islands of insulating material. The height 16 is therefore a matter of design choice and based upon the design and performance of the desired device.

Figure 2:
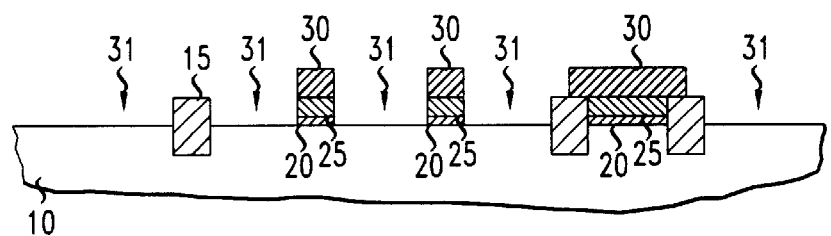

Referring to FIG. 2, a mask of an energy-sensitive resist 30 is then formed on the substrate. The mask defines the regions in the active areas (i.e. the active areas are bounded by the insulating regions 15) in which the islands of insulating material are to be formed. The mask is formed by depositing an energy-sensitive resist 30 on the structure depicted in FIG. 1. The multilayer stack is patterned using standard lithographic techniques. In standard lithography for device fabrication, a pattern is first formed in the energy-sensitive resist material 30. That pattern is then transferred into the underlying layers of silicon nitride 25 and silicon dioxide 20. The pattern has open regions 31 through which the surface of the underlying substrate is exposed. These open regions define the placement of the islands of insulating material in the substrate.

The patterned layer of energy-sensitive material 30 is then removed, leaving the patterned layers of silicon nitride 25 and silicon dioxide 20 on the substrate 10. The resulting structure is then subjected to an elevated temperature in an oxygen-containing atmosphere in order to oxidize the regions 31 of silicon substrate exposed through the mask of patterned layers of silicon nitride 25 and silicon dioxide 20. The thickness of the silicon dioxide regions 35 (FIG. 3) so formed is selected to eliminate the junction leakage current from the devices subsequently formed over the insulating islands. Consequently, the thickness of the silicon dioxide is at least about 15 nm. It is advantageous if the insulating regions also reduce or eliminate the junction capacitance of the devices subsequently formed over the islands of insulating material. In this regard it is advantageous if the islands of insulating material have a thickness of about 50 nm to about 100 nm.

Figure 3:
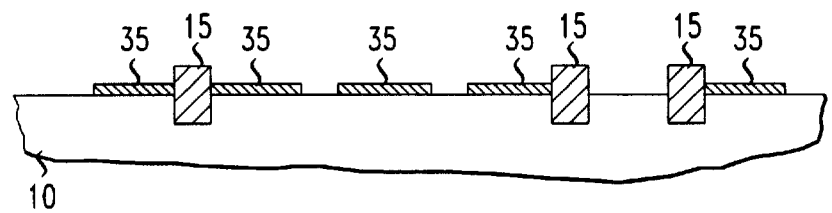
Figure 4:
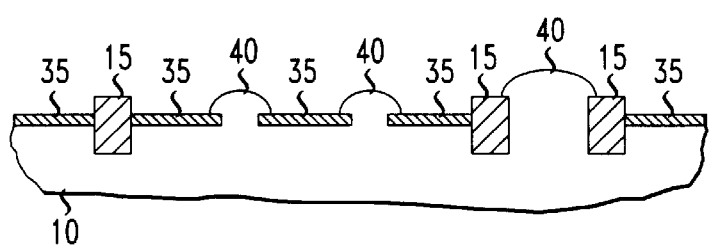

The mask of successive layers of silicon dioxide 20 and silicon nitride 25 is then removed. These layers are removed using the conventional expedients used in the shallow trench isolation process. The silicon nitride is removed using a conventional wet etch expedient (e.g. photonic acid). The wet etch expedient is selective for silicon nitride compared to silicon dioxide and thus, the silicon dioxide is not appreciably removed. After the silicon nitride is removed, the thin silicon dioxide layer 20 is removed using a conventional wet etch expedient (e.g. diluted HF). In this step the silicon dioxide pads 35 and the silicon dioxide in the trenches 15 are etched, but only by the amount necessary to remove the very thin layer 20. The resulting structure is depicted in FIG. 3. The portion of the silicon substrate 10 underlying the removed mask is thereby exposed. Referring to FIG. 4, silicon 40 is then grown on the exposed silicon surfaces of the substrate 10. Single crystal silicon 40 is also deposited over a small portion of the silicon dioxide islands 35 adjacent to the exposed silicon surfaces. Single crystal silicon is otherwise not formed on the silicon dioxide insulating regions 15 and 35.

Figure 5:
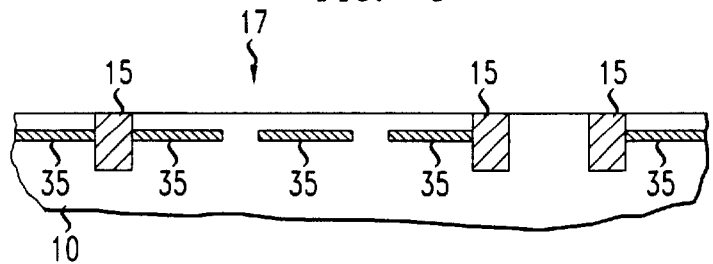

In order to form single crystal silicon over the silicon dioxide islands 35, amorphous silicon is deposited over the structure depicted in FIG. 4. The structure is then heated at a temperature and for a duration sufficient to recrystallize the amorphous silicon. The structure is then further processed to remove the amorphous silicon deposited and recrystallized over the silicon insulating regions and to planarize the substrate surface. Chemical mechanical polishing is one example of a suitable expedient for accomplishing this objective. The resulting structure is illustrated in FIG. 5. The resulting structure has silicon dioxide insulating regions 15 that separate active regions 17 in the substrate 10. At least one active region 17 has silicon dioxide islands 35 formed beneath the single crystalline surface.

The foregoing description is provided to illustrate one embodiment the claimed invention. The description is not to be construed to limit the invention in any way, other than as is consistent with the claims accompanying this application.

What is claimed is:

1. A process for device fabrication comprising:

forming a stop layer on a semiconductor substrate wherein the thickness of the stop layer is selected to define a combined thickness of an insulating region buried beneath a device active region;

forming at least one trench in the stop layer, wherein the trench extends into the silicon substrate;

depositing a layer of dielectric material onto the substrate with the stop layer formed thereon; wherein the trench is filled with the dielectric material thereby forming a trench isolation region;

removing the dielectric material from over the stop layer;

patterning the stop layer to expose a region of the semiconductor substrate there through;

selectively forming a dielectric material on the exposed region of the semiconductor substrate;

removing the stop layer after the dielectric material is selectively formed on the exposed region of the semiconductor substrate; and forming a layer of semiconductor material on the semiconductor substrate and over the dielectric material selectively formed on the exposed region of the semiconductor substrate wherein the layer of semiconductor material formed over the dielectric material defines the active region of a semiconductor device.

2. The process of claim 1 wherein the stop layer comprises a first layer of oxidized silicon formed on the semiconductor substrate on which is formed a second layer of etch stop material selected from the group consisting of silicon nitride, doped silicon dioxide, amorphous silicon and polycrystalline silicon.

3. The process of claim 2 wherein the second layer of the stop layer is at least about ten times thicker than the first layer.

4. The process of claim 1 wherein the dielectric material deposited in the trench is silicon dioxide.

5. The process of claim 1 wherein the silicon dioxide is removed by chemical mechanical polishing.

6. The process of claim 1 wherein the dielectric material formed on the region of the substrate exposed through the stop layer is silicon dioxide.

7. The process of claim 6 wherein the silicon dioxide is formed by subjecting the region of the substrate exposed through the stop layer to a temperature in the range of about 800° C. to about 1100° C. in the presence of oxygen for a time sufficient to form silicon dioxide with a thickness of at least about 15 nm.

8. The process of claim 7 wherein the thickness of the silicon dioxide is about 50 nm to about 100 nm.

9. The process of claim 1 wherein the semiconductor material is silicon.

10. The process of claim 9 wherein the layer of semiconductor material is formed over the dielectric material by epitaxial growth of silicon on the exposed portion of the silicon substrate; depositing amorphous silicon over the epitaxial silicon and the dielectric material and recrystallizing the amorphous silicon.

11. The process of claim 10 further comprising removing the recrystallized silicon that was formed over the trench isolation region.

12. The process of claim 11 wherein the recrystallized silicon is removed by chemical mechanical polishing.

* * * * *